United States Patent
Koning et al.

(10) Patent No.: US 8,686,617 B2
(45) Date of Patent: Apr. 1, 2014

(54) CIRCUIT FOR COMPENSATING INFLUENCE OF TEMPERATURE ON A RESONATOR

(75) Inventors: Jan Jacob Koning, Wijchen (NL); Di Wu, Beijing (CN); Joep Bontemps, Eindhoven (NL)

(73) Assignee: NXP, B.V., Eindhoven (NL)

( * ) Notice: Subject to any disclaimer, the term of this patent is extended or adjusted under 35 U.S.C. 154(b) by 256 days.

(21) Appl. No.: 13/139,481

(22) PCT Filed: Dec. 21, 2009

(86) PCT No.: PCT/IB2009/055885
§ 371 (c)(1),
(2), (4) Date: Jun. 16, 2011

(87) PCT Pub. No.: WO2010/073213
PCT Pub. Date: Jul. 1, 2010

(65) Prior Publication Data
US 2012/0032555 A1      Feb. 9, 2012

(30) Foreign Application Priority Data

Dec. 23, 2008 (EP) ..................... 08172720

(51) Int. Cl.
*H03H 9/02* (2006.01)
(52) U.S. Cl.
CPC ................ *H03H 9/02448* (2013.01)
USPC .......................................... 310/315
(58) Field of Classification Search
CPC ................................. H03H 9/02448
USPC .................. 310/314, 315, 317, 346
See application file for complete search history.

(56) References Cited

U.S. PATENT DOCUMENTS

| 3,129,346 | A | * | 4/1964 | White ........................... 310/321 |
| 4,851,791 | A | | 7/1989 | Marotel |
| 6,501,340 | B1 | | 12/2002 | Flood |
| 7,211,926 | B2 | | 5/2007 | Quevy et al. |
| 7,268,646 | B2 | | 9/2007 | Lutz et al. |
| 2004/0108911 | A1 | | 6/2004 | Satoh |
| 2006/0001329 | A1 | * | 1/2006 | Rao et al. ....................... 310/315 |
| 2006/0026170 | A1 | | 2/2006 | Kreitler et al. |
| 2007/0296527 | A1 | | 12/2007 | Lutz et al. |

FOREIGN PATENT DOCUMENTS

| EP | 0 310 490 A1 | 4/1989 |
| GB | 2 025 721 A | 1/1980 |
| JP | 2003 224421 A | 8/2003 |
| WO | 2004/053431 A2 | 6/2004 |
| WO | 2004/095696 A2 | 11/2004 |
| WO | 2005/025057 A2 | 3/2005 |
| WO | 2006/098857 A2 | 9/2006 |

(Continued)

OTHER PUBLICATIONS

National Semiconductor, "LM35 Precision Centigrade Temperature Sensors", Data sheet, 13 pgs. (Nov. 2000).

(Continued)

*Primary Examiner* — Derek Rosenau

(57) ABSTRACT

The invention relates to a device for compensating influence of temperature on a resonator circuit. The device comprises a resonator circuit and a supply unit for supplying an electric bias signal to the resonator circuit, wherein the supply unit is adapted for adjusting the electric bias signal for compensating influence of temperature on the resonator circuit.

13 Claims, 5 Drawing Sheets

(56) References Cited

FOREIGN PATENT DOCUMENTS

| WO | 2008/149298 | A1 | 12/2008 |
|----|-------------|----|---------|
| WO | 2010/029490 | A2 | 3/2010  |
| WO | 2010/052683 | A2 | 5/2010  |

OTHER PUBLICATIONS

Ho, G. et al. "Low-Motional-Impedance Highly-Tunable $I^2$ Resonators for Temperature-Compensated Oscillators," 18th IEEE Int'l. Conf. on Micro Electro Mechanical Systems, pp. 116-20 (2005).

Ho, G. et al. "Temperature Compensated IBAR Reference Oscillators," $19^{th}$ IEEE Int'l. Conf. on Micro Electro Mechanical Systems, pp. 910-13 (2006).

Van Beek, J., et al. "Scalable 1.1GHz Fundamental Mode Piezo-Resistive Silicon MEMS Resonator", IEEE Int'l. Electron Devices Meeting, pp. 411-13 (2007).

Bendida, S., et al. "Temperature Stability of a Piezoresistive MEMS Resonator including Self-Heating", J. Microelectronics Reliability 48, 5 pgs. (2008).

Innovative Sensor Technology, "Platinum Temperature Sensors," Data sheet, 18 pgs. (2009).

On Semiconductor, "LM258, LM358, LM358A, LM2904, LM2904A, LM2904V, NCV2904—Single Supply Dual Operational Amplifiers", Data sheet, 14 pgs. (2010).

International Search Report and Written Opinion for International Patent Application No. PCT/IB2009/055885 (Oct. 21, 2010).

\* cited by examiner

CIRCUIT FOR COMPENSATING INFLUENCE OF TEMPERATURE ON A RESONATOR

FIELD OF THE INVENTION

The invention relates to a circuit for compensating influence of temperature on a resonator circuit.

Beyond this, the invention relates to a method of compensating influence of a temperature on a resonator circuit.

Moreover, the invention relates to a program element.

Furthermore, the invention relates to a computer-readable medium.

BACKGROUND OF THE INVENTION

In the field of radios, telecommunications, computers and other electronic applications, devices may comprise resonators for providing a resonator frequency. Such resonators may be used in Micro-Mechanical-Systems. Micro-Electro-Mechanical Systems may be denoted as the technology of the very small members, and merges at the nano-scale into nano-electromechanical systems (NEMS) and nanotechnology. MEMS may be made up of components between 1 μm to 100 μm in size and MEMS devices may generally range in size from 20 μm to 1 mm.

Resonators, in particular MEMS resonators are typically made of silicon, show production spread and a temperature dependent resonant frequency, which is due to the material properties for example of silicon. The electrical conductivity in an MEMS resonator is dependent on e.g. the strain in the resonator.

An MEMS resonator may comprise a piezo-resistive element. An electric bias signal through the resonator is used to generate an oscillating voltage or current that serves to sense the oscillation of the resistor in the resonator. Due to dissipation, this bias signal will heat up the device. The bias signal may be a dc bias current. The bias current is necessary for the read out of the piezo-resistive element in the resonator. A larger current may also change the frequency due to self heating and the temperature dependency of a spring constant.

The prior art MEMS resonators suffer from one or more of the above drawbacks.

OBJECT AND SUMMARY OF THE INVENTION

It is an object of the invention to provide a simple circuit for efficiently compensating the influence of temperature on a resonator circuit, further overcoming one or more of the above drawbacks.

In order to achieve the object defined above, a device for compensating influence of temperature on a resonator circuit, a method of compensating influence of temperature on a resonator circuit, a program element and a computer-readable medium according to the independent claims are provided.

According to an exemplary embodiment of the invention, a device is provided which comprises a resonator circuit and a supply unit for supplying an electric bias signal to the resonator circuit, wherein the supply unit is adapted for adjusting the electric bias signal for compensating influence of temperature on the resonator circuit.

According to another exemplary embodiment of the invention, a method of compensating influence of temperature on a resonator circuit is provided. The method may comprise supplying an electric bias signal to the resonator circuit and adjusting the electric bias signal for compensating influence of temperature on the resonator circuit.

According to still another exemplary embodiment of the invention, a program element (for instance a software routine, in source code or in executable code) is provided, which, when being executed by a processor, is adapted to control or carry out a compensating method having the above mentioned features.

According to yet another exemplary embodiment of the invention, a computer-readable medium (for instance a semiconductor memory, a CD, a DVD, a USB stick, a floppy disk or a harddisk) is provided, in which a computer program is stored which, when being executed by a processor, is adapted to control or carry out a compensating method having the above mentioned features.

Compensating influence of temperature on a resonator circuit, which may be performed according to embodiments of the invention, can be realized by a computer program, that is by software, or by using one or more special electronic optimization circuits, that is in hardware, or in hybrid form, that is by means of software components and hardware components. The present invention envisages all the above compensation mechanisms.

Such devices may be produced with some process spread in absolute resonant frequency. During the device design, it may be possible to include the influence of self-heating in the calculated resonant frequency. Therefore, a device may be provided which comprises a resonator circuit and a supply unit for supplying an electric bias signal to the resonator circuit. The resonator circuit may be for example a piezo-resistive oscillator. Such a piezo-resistive resonator has e.g. been described in an earlier application of the present inventor, filed Jul. 23, 2008. The supply unit may be an amplifier for providing a dc bias voltage or current as electric bias signal. The supply unit may be adapted for adjusting the electric bias signal for compensating influence of temperature on the resonator circuit. The electric bias signal may be adjusted for instance during the design of a circuit or during operation.

For instance, for an accuracy of device voltage or current of 1% at fixed reference ambient temperature, this would result in an increased spread of the absolute value for the resonance frequency. This may be for example about 50 ppm (parts per million) from the target frequency.

The advantage as compared to keeping the device bias current low enough to prevent frequency shift by self-heating, may be that in this device, a larger read-out current or voltage signal may be provided. This may give a potential to have less need for feedback amplification, or perhaps even a self-sustaining oscillator without active amplification. Ceramic resonators with a frequency tolerance of more than 3000 ppm over 100K (Kelvin) may be replaced by such a device.

In the following, further exemplary embodiments of the device will be explained, as well as the advantages of the present invention. However, these embodiments also apply to the method, to the program element and to the computer-readable medium.

The resonator circuit may comprise piezo-resistive resonators. These resonators may conduct DC current. The current may flow through the device and may heat it. In particular, the term comprise may denote in this case that the resonator circuit is of a piezo-resistive type.

The electric bias signal may be dependent on a bias parameter, wherein the bias parameter is fixed to a specific value indicative of a resonant frequency incorporating a temperature influence.

The bias parameter may be determined during a trimming process at a reference temperature. With this embodiment, it may be realized that a part of a temperature influence is caught by this parameter. Thus, the bias parameter may compensate the processing variation of the resonant frequency.

The device may further comprise a temperature sensing unit for measuring an ambient temperature, wherein the temperature sensing unit is coupled to the supply unit for adjusting the electric bias signal in dependency of the measured temperature.

The electric bias signal or bias voltage or current through the resonator circuit may be made dependent on the ambient temperature. Due to the self heating effect, the device resonant frequency may be maintained for different ambient temperatures. This may correct for the temperature dependency of the resonant frequency by a setting based on a sensor that provides a measure for the ambient temperature. A straight feed-forward system, without control loops may be sufficient to stabilize the resonant frequency. The temperature drift may thus be limited to less than 200 ppm over 100 Kelvin instead of the uncompensated 3000 ppm per 100 Kelvin.

The supply unit may be coupled to an electric supply voltage internally of the device. This may provide a compact and small device without the need of external supply.

The device may comprise a further resonator circuit, wherein the resonator circuit and the further resonator circuit are adapted for operation as a frequency source in a specific temperature range.

By using several N resonators in parallel that differ by 3000/N ppm in resonant frequency at a given reference temperature, for instance room temperature, the heating current may be reduced by nearly factor N, in which case each resonator will be suitable as a frequency source for a specific temperature range. Thus, it may be possible for thin resonators, that less of power will be consumed in the device for the frequency fixation at reference temperature and also for the drift compensation, which may be limited to less than 4 mW. Therefore, the device may be suitable for many applications like USB, microprocessors etc. which have restrictions on power consumption.

By having very thin silicon devices, with narrow anchors, it may appear that the heat conductivity is very low. A silicon resonator may only need a limited power dissipation of 10 mW or less in order to be heated by some 100K. The heat conductivity may determine the heat loss and subsequently the heating power to keep the resonance frequency stable. This may be proportional to the thickness of the MEMS anchors. Therefore, the use of thin (1 to 2 um thickness) resonators, like SOI, polysilicon etc, may make it possible to consume around 10 mW of power for stabilizing the resonant frequency over an ambient temperature range of 100K. The thickness may be an advantage as the heat conductivity between heated MEMS device and anchored substrate at ambient temperature may determine the power that is needed to maintain the device at the required resonant frequency.

The device may be adapted as a monolithically integrated circuit. Thus, the whole circuit plus resonator may be integrated on the same monolithic silicon chip or die. The device may contain an extra external pin for client as a feature to trim the temperature dependent characteristic according to the desires of the client, by adjusting the supply unit, which may be an amplifier, that determines the temperature dependent bias signal or current or bias voltage on the resonator. This may also be combined with another external pin for bias trimming to compensate the process spread.

The resonator circuit may be arranged on one chip and the remaining parts of the device on one or more other chips. The MEMS resonator may be made on one die or chip and the circuit for part or completely on one or more other dies. Part of the circuit may be integrated within the same die with the resonator as well.

The device of two or more dies may be placed within the same package being connected by bond wires or similar pad to pad connections, or in two or more different packages, like BGA, SMD, QFP etc. having electrical pins or contact balls to the exterior. The separate two chip system may comprise one extra pin on the circuit for the bias trimming for compensating the process spread. In the implementation of a two package system, this may require one extra pin for trimming. This pin may be a feature of the product that enables the client to do a minor adjustment of for example 500 ppm on the absolute frequency if desired.

Though the monolithic single chip system may not need such an external pin for trimming, it may also contain this as a feature for the client.

The device may be realized as at least one of the group consisting of a mobile phone, a headset, a headphone playback apparatus, a hearing aid, a television device, a video recorder, a monitor, a gaming device, a laptop, an audio player, a DVD player, a CD player, a hard disk-based media player, a radio device, an internet radio device, a public entertainment device, an MP3 player, a car entertainment device, a medical communication system, a medical device, a body-worn device, a speech communication device, a home cinema system, a home theatre system, a flat television apparatus, an ambiance creation device, a studio recording system, and a music hall system, a thin identification or smart card, a SIM card, and a key or other remote control device.

The device may be adapted as a micro-electro-mechanical system.

Preferably, the device may be used in Micro-Electro-Mechanical Systems, also known as MEMS systems. Micro-Electro-Mechanical Systems may be denoted as the technology of the very small members, and merges at the nano-scale into nano-electromechanical systems (NEMS) and nanotechnology. MEMS may be made up of components between 1 µm to 100 µm in size and MEMS devices may generally range in size from 20 µm to 1 mm. With further development of technology also smaller devices are envisaged.

Further, the device may also comprise MEMS resonators that are not necessary used as resonators, but also for gyroscopes, microphones, loudspeakers, ultrasound transducers, accelerometers or other semiconductor based vibrating MEMS that have a temperature dependent stiffness (Young modulus).

Further, instead of silicon, other semi-conducting material for MEMS may be used, like germanium, GaAs, SiC etc.

In the following, further exemplary embodiments of the method will be explained. However, these embodiments also apply to the device, to the program element and to the computer-readable medium.

The method may further comprise measuring an ambient temperature and adjusting the electric bias signal according to the measured temperature.

The temperature dependency of the electric bias signal or dc bias voltage or current through the resonator may be trimmed in order to improve the stabilization of the resonant frequency over ambient temperature range to a few tens of ppm. Trimming may be done after assembly of the resonator die with the circuit die in a two chip device, or in a monolithic chip where the resonator is integrated with the circuit.

The method may further comprise trimming the bias parameter in order to provide a resonant frequency equal to a reference value.

Thus, the bias parameter may be trimmed in order to bring the resonant frequency of the device closer to the specified value for a determined reference value of the ambient temperature. An accuracy improvement better than the untrimmed case may bring the absolute resonance frequency closer to the target frequency. Accuracy levels comparable to quartz crystals of 20 ppm or better may be achievable by this method. This trimming at reference temperature may compensate for processing variations of the device resonant frequency, which is a major problem for creating MEMS oscillators on a precise reference frequency. The resulting MEMS resonator may show a reduced frequency spread at reference temperature, for instance 20 ppm plus accuracy of the reference temperature of about 1K, i.e. 30 ppm, on frequency at fixed temperature, but still a temperature drift of 3000 ppm over 100 K.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF EMBODIMENTS

Figure 1:
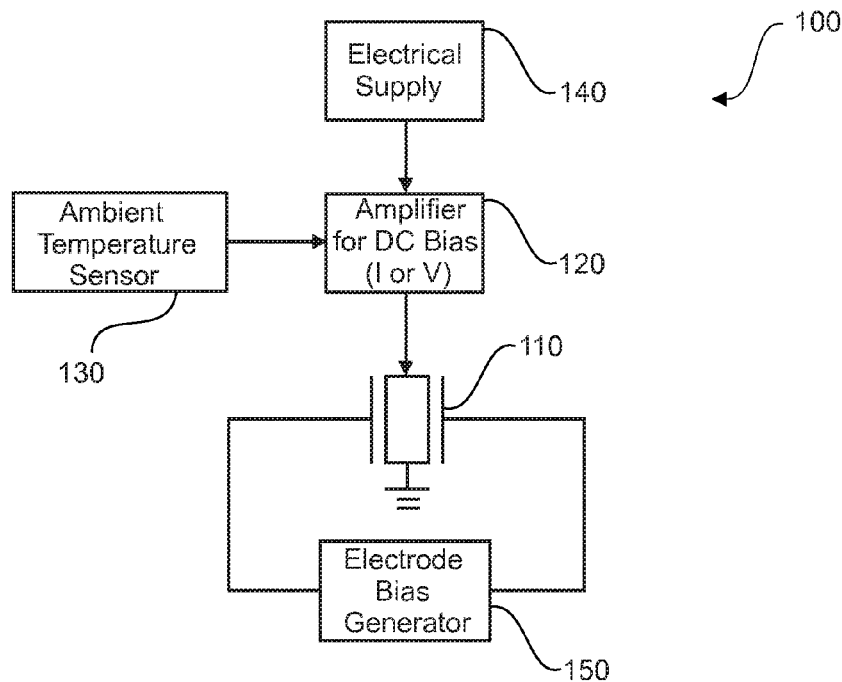
FIG. 1 illustrates a device for compensating influence of temperature on a resonator circuit according to an exemplary embodiment of the invention.

The illustration in the drawing is schematically. In different drawings, similar or identical elements are provided with the same reference signs.

Figure 3:
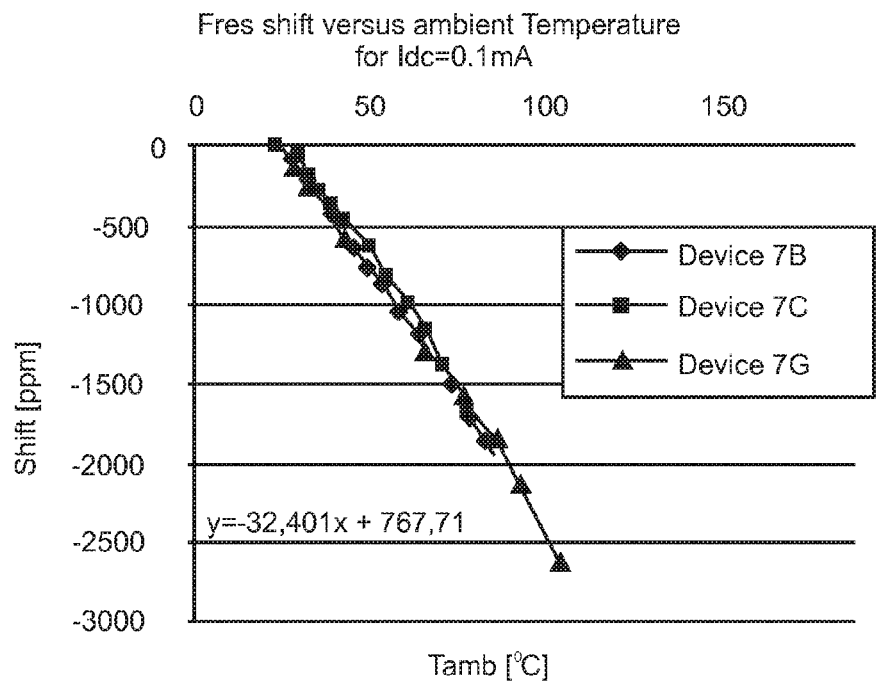
FIG. 3 illustrates MEMS resonant frequency shift.

Referring to FIG. 3, MEMS resonators made of silicon show production spread and a temperature dependent resonant frequency, which is due to the material properties of silicon. MEMS resonant frequency shifts to a lower value if the ambient temperature is increased. The linear behavior is expected from the temperature dependent Young modulus of crystalline silicon. At this current of 0.1 mA, the device does not heat up enough to see a considerable non-linear effect of self heating in the frequency, ie it is mainly linear.

In the concept of the piezo-resistive MEMS resonator the oscillation results in an oscillating value for the resistance $\delta R/R$ (which has to be read as delta R/R) due to the piezo-resistive effect. This effect describes the dependency of the electrical conductivity in the MEMS resonator on the strain in the resonator.

An electric bias signal or dc bias current (or voltage) through the resonator is used to generate an oscillating voltage or current that serves to sense the oscillation of the resistor. In case of a constant voltage, the amplitude of this signal $\delta I$ (delta I) is proportional to the dc bias current I due to the oscillating resistance $\delta R/R$, but it can also be sensed with a current source and oscillating voltage $\delta V/V$ (delta V/V).

Due to dissipation this bias current will heat up the device. The bias current is necessary for the read out of the piezo-resistive device. Problem is that a larger current will also change the frequency, as may be seen in FIG. 4, due to self heating and the temperature dependency of the spring constant (stiffness, basically the Young modulus).

Figure 4:
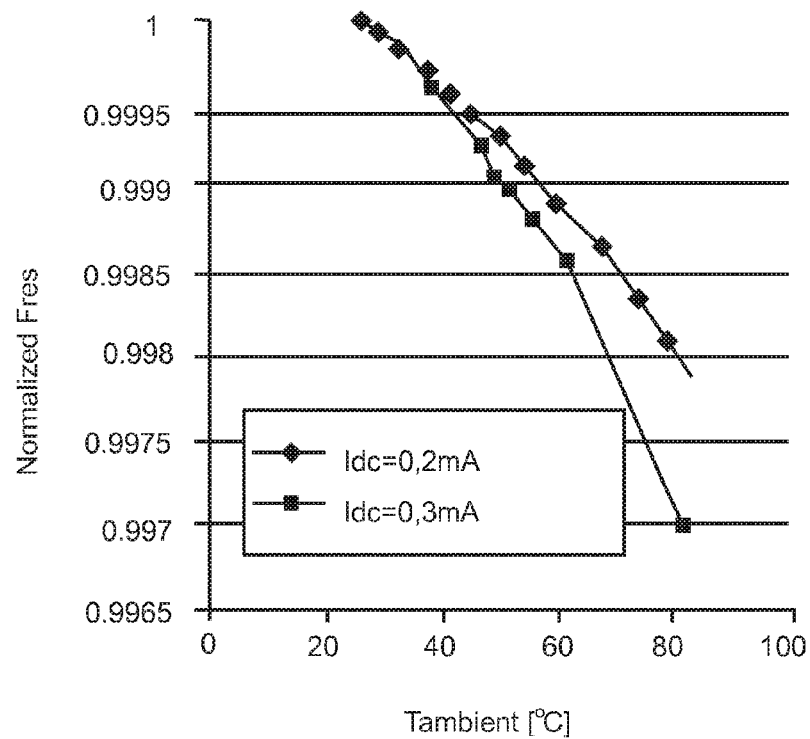
FIG. 4 illustrates a diagram comparing resonance frequency with ambient temperature.

FIG. 4 shows a relative resonance frequency df/f versus ambient temperature. In these resonators, which have an electrical resistance greater than 20 kOhm, self heating occurs that causes bigger decrease of the resonant frequency than in FIG. 3. Reason for the non-proportional decrease is the temperature dependent increase of both the electrical resistance of the doped silicon resonator and thermal resistance of silicon. For a device with 10× lower resistance the current should be sqrt(10,) about 3× smaller to have the same dissipation.

Figure 2:
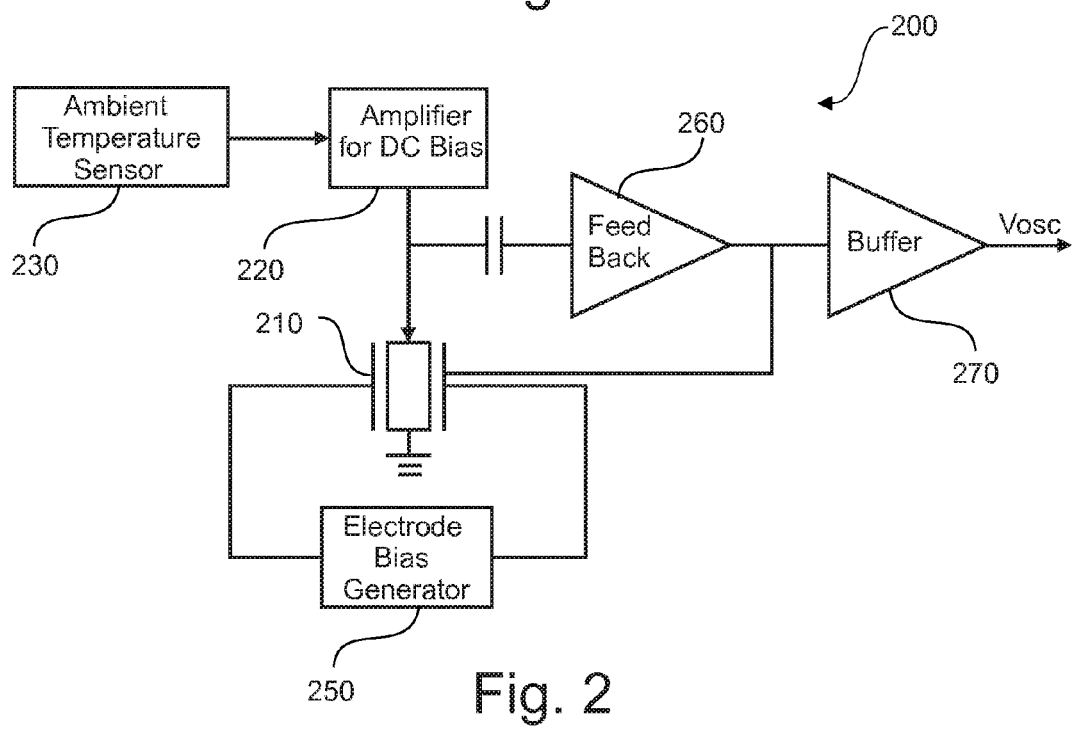
FIG. 2 illustrates a block diagram of a piezo-resistive oscillator according to an exemplary embodiment of the invention.

With the device 100, 200 shown in FIGS. 1 and 2, the processing variation of the resonant frequency and the temperature dependency of the resonant frequency are compensated. The method makes use of the device heating caused by this bias current. The power consumption may be limited thus making it a useful option for applications where less than 10 mW is allowed.

As may be seen in FIGS. 1 and 2, the dc bias current (or voltage) from an amplifier or supply unit 120, which is supplied from an electrical source 140 and which gets its input from another circuit (temperature sensing unit) 130 that senses the ambient temperature. Well known as temperature sensor are so-called PTAT, Proportional to Absolute Temperature circuits, based on bandgap of a bipolar transistor, but also higher order non-linear relationship to temperature can be suitable.

The voltage (or current) dc bias that is supplied to run through the resonator 110 can be given as:

$$V(Ta)=V0+f(Ta) \quad (1)$$

In (1), Ta denotes the ambient temperature, V0 denotes the bias parameter for instance determined by trimming at a reference temperature and f( ) denotes a function that can be linear, quadratic or otherwise.

If f( ) is greater than 0 and linear, this results in $$V(Ta)=V0+b*Ta \quad (2)$$

But which can also be implemented as a higher order correction to temperature.

There are two bias voltages possible: one runs through the resonator 110, 210 and provides the read-out signal as it is modulated by the oscillating piezo-resistance, the other one is not considered in (1) and (2) which is the electrode bias voltage ranging from a few to possibly 80V or more and which contains the fed-back oscillator signal to drive the resonator as in FIG. 2.

An example of an implementation of the resonator with bias circuit as a MEMS oscillator includes also a feedback amplifier 260 which is possibly ac-coupled to the readout signal which is superposed on the DC bias current (or voltage), and it commonly includes an output buffer 270 to provide the power to the outside connected load. Together with the compensation part of the circuit it could look like in FIG. 2.

The higher the ambient temperature, the lower will be the bias current that is sent through the device, as the resonant frequency of the silicon resonator 110, 210 always decreases by about 25 to 30 ppm/K. As the readout signal of the resonator will also decrease with the bias current, the feedback amplifier 260, which could be provided by an external chip, would suffer from insufficient signal to sustain the oscillator signal. However, this can be compensated by increasing the electrode bias voltage, which together can keep the signal amplitude constant.

The temperature dependent bias current can be combined with control of the electrode bias voltage. The advantage is that the amplitude of the resonator signal can be maintained even though the current through the device 100, 200 might be changed in bias. This may be implemented by adding a connection between a electrode bias generator 150, 250 and the temperature sensing circuit 130, 230 or amplifier 120, 220.

The read out current may be used simultaneously for the heating of the device and by increasing the read-out signal $\delta V$ (delta V) or $\delta I$ (delta I) by dimensioning the bias in the self heating regime. This way the heating current contains the piezo-resistive oscillating signal of the MEMS. The ac signal amplitude depends linearly on the bias current. Thus an option is created to increase the ac signal to larger amplitudes without suffering from the effect it has on the frequency. This is economical for the piezo resistive resonator, as a large read-out signal requires less power for the feed-back amplifier to sustain the oscillation. The device takes an advantage by including the self heating effect into the design of the resonator and thus allowing for much bigger signal amplitude.

Another advantage of controlling the signal amplitude by the electrode voltage in combination with the dc bias current through the device is that it can be used to stabilize the phase of the resonator signal, as the sensed resonator signal is the modulated resistance plus the oscillating capacitance value as well, and these two signals do not have the same phase.

Figure 5:
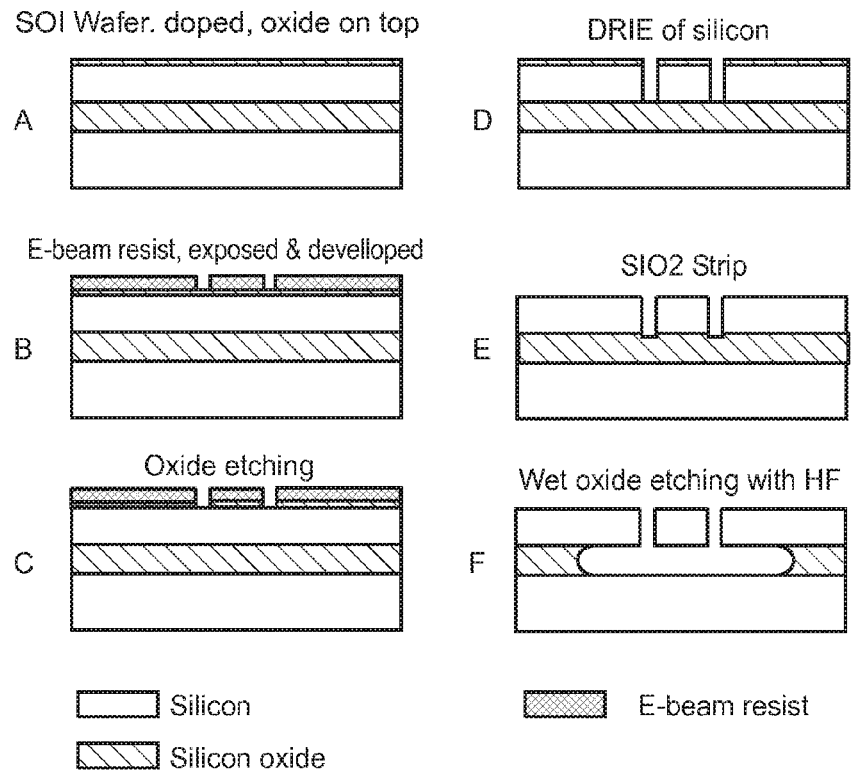
FIG. 5 illustrates a conventional method of manufacturing a MEMS resonator.

As illustrated in FIG. 5, the resonator can be defined by etching trenches, after which the component is released from the substrate by removing (BOE etch or HF vapor etch) the buried oxide layer from the SOI wafer. Other methods to release MEMS exist like in bulk silicon wafers or polysilicon on prepared silicon wafers.

The dimension of the anchors largely affects the thermal resistance to the substrate of a free-free beam resonator, or variations like a dogbone shaped resonator. By increasing the anchor length from for example 3 μm to 9 μm, the thermal resistance of the resonator increases more than 50%.

Figure 6:
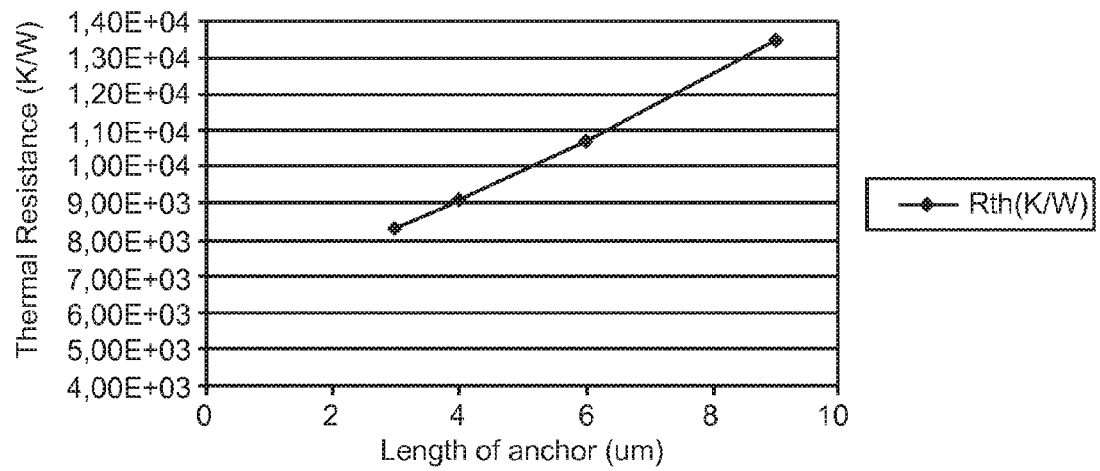
FIG. 6 illustrates different thermal resistances of resonators with different anchor lengths.

FIG. 6 shows an increasing trend of thermal resistance by prolongation of the anchor length. Effective heating of the resonator by 13.5K would need 1 mW of power in these realistic simulations. 7 mW is sufficient to heat the resonator by about 100K. This proves the feasibility of the principle for many applications.

A dogbone resonator shows an inhomogeneous temperature. The gradient is mainly in the anchors, which have been given an extra length to increase heat resistance. Thus a limited power is sufficient to bring the device temperature up until it has the desired resonant frequency.

Figure 7:
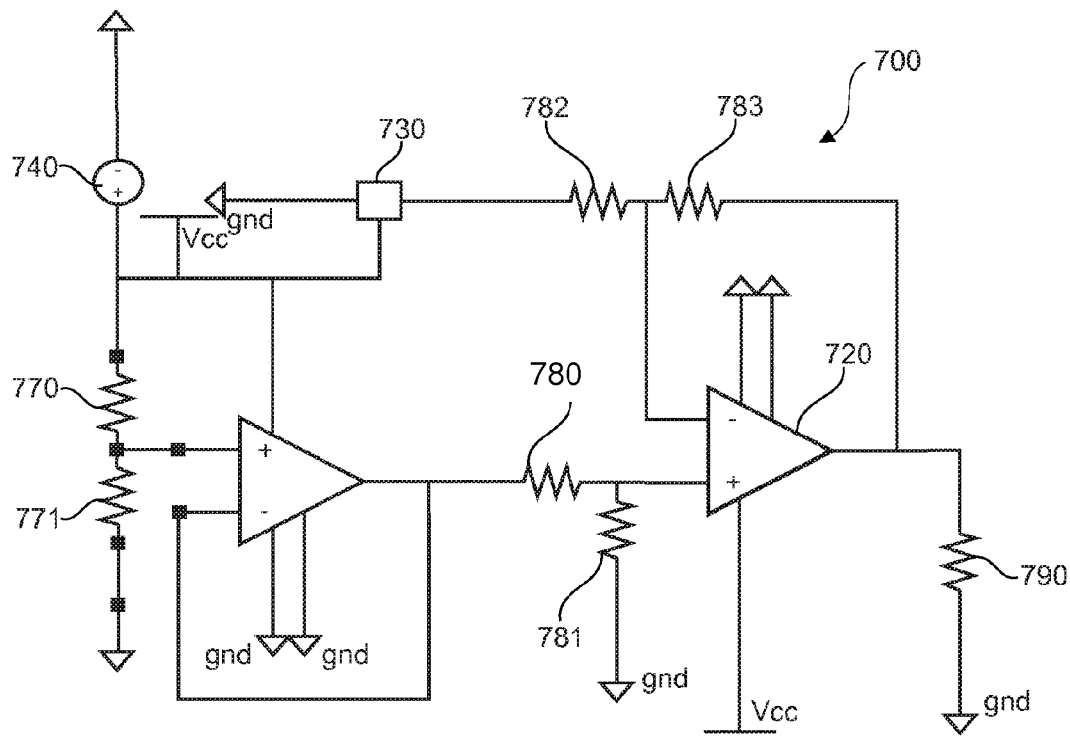
FIG. 7 illustrates a block diagram showing a circuit according to an exemplary embodiment of the invention.

FIG. 7 illustrates a block diagram showing a compensation circuit 700 according to an exemplary embodiment of the invention. In this circuit, a voltage source 740 is used to control the current through the device 700 resulting in an elevated inhomogeneous resonator temperature.

The circuit 700 comprises several resistors which may be used for trimming. Further, the circuit comprises two amplifiers, wherein the first amplifier is coupled to the voltage source and resistors 770 and 771 which are part of the same potentiometer. The output of the first amplifier is coupled to a resistor 780 and comprises a feedback loop to an input of the first amplifier. The second amplifier 720 is coupled between resistors 782, 783 of one potentiometer and 780, 781 of one potentiometer. An output of the second amplifier is feedback coupled to the resistor 783 and to a resistor 790. The circuit further comprises a temperature sensing unit 730.

For trimming the frequency at a reference temperature, for instance the resistors 770 or 771 could be trimmed. For trimming of the linear temperature dependence, resistors 780, 781, 782 and 783 could be trimmed. Resistor 790 is an external load.

Figure 8:
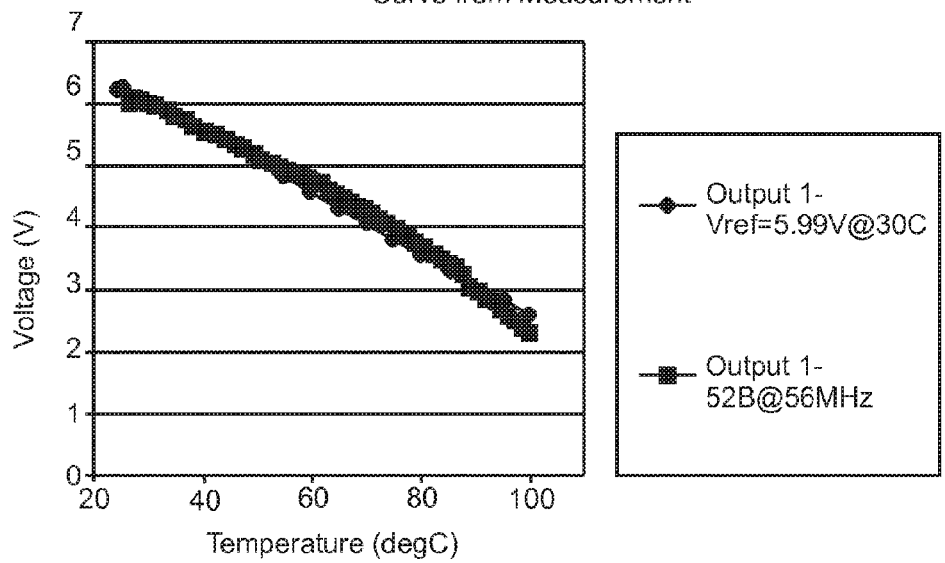
FIG. 8 illustrates a curve of a dog-bone shaped resonator.

In FIG. 8, a dog bone resonator curve is shown illustrating a voltage over resonator at various ambient temperatures, while keeping the resonant frequency constant. The second curve (Output1) shows a voltage produced by ambient temperature sensing circuit. The used resonator has an anchor length of 3 um. The dogbone voltage is the voltage over the dogbone resonator which is obtained while keeping the resonant frequency constant for a range of ambient temperatures. The Output 1 in FIG. 8 is the output voltage of the temperature dependent sensing circuit, which it is linear with temperature. It is shown that the linear output is a reasonable approximation of the behavior of the dogbone resonator.

Figure 9:
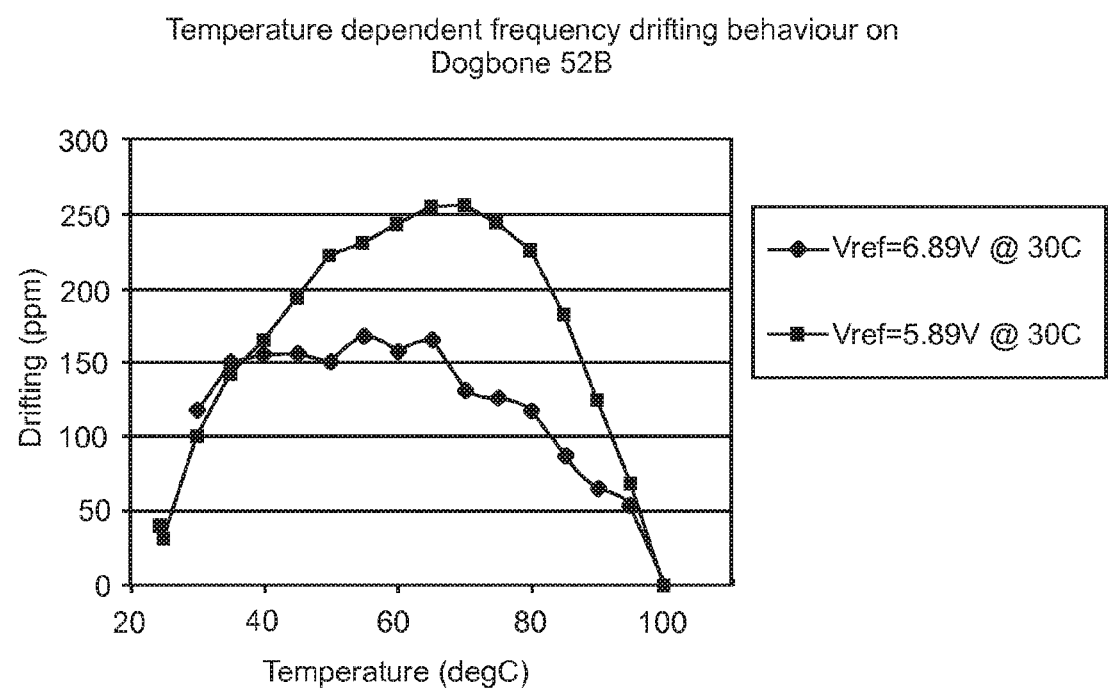
FIG. 9 illustrates a frequency stability over ambient temperature.

In FIG. 9, a frequency stability over ambient temperature is shown. The measured frequency drift of resonator 52B by applying the untrimmed bias control circuit.

Low power and accuracy for this concept is essential to be a replacement for TCXO Quartz based oscillators and PLL based oscillators. The accuracy of trimming determines how well trimming the heating bias current at a reference temperature can achieve a precise resonant frequency.

Trimming to correct a process spread of 500 ppm will require a voltage trim range of about 0.8V which is very reasonable. It is something like 10% of the bias voltage at room temperature. A 1% accuracy in bias voltage corresponds to about 50 ppm in frequency accuracy, or even 36 ppm for a different bias setting. 1% accuracy of a voltage reference should be possible for an untrimmed circuit. By trimming, a better accuracy can be achieved which will result in an accuracy comparable to quartz crystals (10 to 20 ppm). The advantage of the invention is the largest in case of a monolithic integration, as trimming can be done batch wise on wafer level, which is more efficient, and binning (i.e, selection of quartz crystals according to frequency deviation) is not required.

The power consumed is largest when the ambient temperature is lowest. As the anchor length of a tested device is 3 um, simulation shows that with longer anchors the thermal resistance in the anchors can easily be increased so that the heating can be reduced. The simulation indicates that a reduction of 50% realistic. More degrees of freedom are in the resonator geometry, like length, thickness, anchor width and also dope influences the place where the dissipation takes place. The device and the method may be used for all variations of piezo resistive MEMS devices in which current can dissipate energy i.e. semiconductor materials.

The frequency stability over ambient temperature that is shown above is about 170 ppm. The temperature sensor is linear with temperature. For a quadratic dependency, a much lower dependency on temperature should be achievable.

In order to lower the power consumption, the narrow anchors in the resonator device may be extended so that the heat resistance from the heated device to the fixation on substrate (ambient heat sink) increases. Thus less power has to be dissipated in the device for reaching an elevated temperature at stabilized frequency. This principle is generally applicable to other MEMS as well and in the case of thin MEMS it results in rather low power dissipation to heat the device.

In case of an array of resonators that divide the temperature range into smaller pieces in order to limit power consumption, switches should make the electrodes share the same voltage if two adjacent resonators have to take over the oscillation from each other, making them resonate in phase. This prevents a phase jump in the oscillator signal if one resonator would take over from another one while the ambient temperature would transfer from one temperature range to another.

Badge produced wafer level trimming of a monolithic integrated MEMS resonator plus circuit on wafer level is cheaper and faster and more accurate. Other concepts to compensate for temperature drift of MEMS resonators include PLL's with dividers, or use CMOS oscillators without mechanical resonators, easily exceed 20 mW in power consumption. With this invention, much less power has to be spend.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A device comprising:
    a resonator having a first resonant frequency at a first temperature;
    a supply unit, coupled to the resonator, for supplying an electric bias signal to the resonator; and
    a temperature sensing unit, for measuring an ambient temperature, coupled to the supply unit;
    wherein the supply unit heats the resonator with the electric bias signal to the first temperature as a function of the measured ambient temperature.

2. The device according to claim 1,
    wherein the resonator circuit comprises a plurality of piezo-resistive resonators.

3. The device according to claim 1,
    wherein the electric bias signal is dependent on a bias parameter, and
    wherein the bias parameter is fixed to a specific value indicative of a resonant frequency incorporating a temperature influence.

4. The device according to claim 1, wherein
    the supply unit is coupled to an electric supply voltage internally of the device.

5. The device according to claim 1, further comprising:
    a further resonator circuit, wherein the resonator circuit and the further resonator circuit are adapted for operation as a frequency source in a specific temperature range.

6. The device according to claim 1,
    wherein the device i adapted as a monolithically integrated circuit.

7. The device according to claim 1, wherein the resonator circuit is arranged on a first chip and the remaining parts of the device are arranged on at least one other chip.

8. The device according to claim 1,
    wherein the device is at least one of a group including a mobile phone, a headset, a headphone playback apparatus, a hearing aid, a television device, a video recorder, a monitor, a gaming device, a laptop, an audio player, a DVD player, a CD player, a harddisk-based media player, a radio device, an internet radio device, a public entertainment device, an MP3 player, a car entertainment device, a medical communication system, a medical device, a body-worn device, a speech communication device, a home cinema system, a home theatre system, a flat television apparatus, an ambiance creation device, a studio recording system, a music hall system, a thin identification or smart card, a SIM card, and a remote control device.

9. The device according to claim 1,
    wherein the device is adapted as a micro-electro-mechanical system.

10. The device according to claim 1:
    wherein the supply unit maintains the resonator at the first temperature by increasing the electric bias signal in response to a decrease in the measured ambient temperature; and
    wherein the supply unit maintains the resonator at the first temperature by decreasing the electric bias signal in response to an increase in the measured ambient temperature.

11. The device according to claim 1, further comprising:
    an electrode bias generator, coupled to the resonator, for supplying a fed-back oscillator signal to the resonator;
    wherein the electric bias signal from the supply unit and the fed-back oscillator signal from the electrode bias generator are separately coupled to the resonator.

12. The device according to claim 1
    wherein the resonator is coupled to the device with an anchor, having a heat resistance;
    wherein the electric bias signal is decreased in response to an increase in the anchor heat resistance so as to maintain the resonator at the first temperature; and
    wherein the electric bias signal is increased in response to a decrease in the anchor heat resistance so as to maintain the resonator at the first temperature.

13. The device according to claim 12:
    wherein the anchor heat resistance is a function of one from a group consisting of: length, thickness, width, and doping level.

* * * * *